(12) United States Patent
Wu et al.

(10) Patent No.: US 12,191,377 B2
(45) Date of Patent: Jan. 7, 2025

(54) METHOD FOR FORMING A SEMICONDUCTOR STRUCTURE

(71) Applicant: United Semiconductor (Xiamen) Co., Ltd., Fujian (CN)

(72) Inventors: Jun Wu, Wuxi (CN); Shih-Hsien Huang, Kaohsiung (TW); Wen Yi Tan, Fujian (CN); Feng Gao, Shamen (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 421 days.

(21) Appl. No.: 17/560,222

(22) Filed: Dec. 22, 2021

(65) Prior Publication Data

US 2023/0138009 A1 May 4, 2023

(30) Foreign Application Priority Data

Nov. 3, 2021 (CN) .......................... 202111293901.0

(51) Int. Cl.
*H01L 29/66* (2006.01)
*H01L 21/02* (2006.01)
*H01L 21/311* (2006.01)

(52) U.S. Cl.
CPC .... *H01L 29/66568* (2013.01); *H01L 21/0217* (2013.01); *H01L 21/02211* (2013.01); *H01L 21/02271* (2013.01); *H01L 21/02318* (2013.01); *H01L 21/31116* (2013.01)

(58) Field of Classification Search
CPC ..................... H01L 21/31116; H01L 29/66568
See application file for complete search history.

(56) References Cited

U.S. PATENT DOCUMENTS

| | | | |
|---|---|---|---|
| 6,803,321 B1* | 10/2004 | Blosse | H01L 21/3185 257/E21.507 |
| 10,062,943 B2 | 8/2018 | Li | |
| 10,109,474 B1 | 10/2018 | Wang | |
| 10,153,342 B1 | 12/2018 | He | |
| 10,262,986 B2 | 4/2019 | Dai | |
| 10,460,980 B2 | 10/2019 | Verma | |
| 2009/0032877 A1* | 2/2009 | Visokay | H01L 29/7847 257/E21.409 |
| 2012/0074533 A1* | 3/2012 | Aoyama | B32B 15/04 257/632 |
| 2018/0350668 A1* | 12/2018 | Cheng | C23C 16/345 |
| 2021/0020445 A1* | 1/2021 | Wang | H01L 21/0217 |

* cited by examiner

*Primary Examiner* — Walter H Swanson
(74) *Attorney, Agent, or Firm* — Winston Hsu (57) ABSTRACT

A method for forming a semiconductor structure includes forming a gate structure on a substrate, performing a deposition process to form a nitride layer to cover the substrate and the gate structure, performing an in-situ annealing process to the nitride layer, and performing an anisotropic etching process to the nitride layer after the in-situ annealing process to form a spacer on a sidewall of the gate structure.

10 Claims, 9 Drawing Sheets

METHOD FOR FORMING A SEMICONDUCTOR STRUCTURE

BACKGROUND OF THE INVENTION

1. Field of the Invention

The present invention relates to a method for forming a semiconductor structure. More particularly, the present invention relates to a method for forming a semiconductor structure with a spacer having a wider bottom width.

2. Description of the Prior Art

In conventional semiconductor industry, polysilicon has been widely used to form the gate electrode of a semiconductor transistor, such as a metal-oxide-semiconductor (MOS) transistor. As the dimensions of the MOS transistors continue to shrink, conventional polysilicon gate has been limited for these unavoidable problems, such as performance degradation due to boron penetration and depletion effect. The depletion effect may cause the gate dielectric layer having a larger thickness at an equivalent oxide thickness and a smaller capacitance, leading to a degradation of current driving ability. In advanced technology, extensive research has been made to manufacture the gate with other materials to improve the device performance. Work function metals have been proposed to replace polysilicon for forming control gates on high-k gate dielectric layers.

After forming a gate structure, a spacer may be formed on the sidewall of the gate structure. When forming the spacer, over-etching may cause an undercut profile at the bottom portion of the spacer, and the etching gases may penetrate through the spacer and cause damage to the interfacial layer or high-k dielectric layer under the gate structure. There is still a need in the field to resolve the problem.

SUMMARY OF THE INVENTION

In light of the above, the present invention provides a method for forming a semiconductor structure. After depositing the nitride layer, an in-situ annealing process is performed in the deposition chamber to densify the nitride layer right. The densified nitride layer may form a spacer with an extended bottom portion and a larger bottom width (thickness) after being etched by an anisotropic etching process. The spacer with a larger bottom width may reduce the risk of damaging the interfacial layer or high-k dielectric layer under the gate structure during the anisotropic etching process.

According to an embodiment of the present invention, a method for forming a semiconductor structure includes the steps of forming a gate structure on a substrate, performing a deposition process to form a nitride layer to cover the substrate and the gate structure, performing an in-situ annealing process to the nitride layer, and performing an anisotropic etching process to the nitride layer after the in-situ annealing process to form a spacer on a sidewall of the gate structure. A process temperature of the deposition process is between 600° C. and 650° C. A process temperature of the in-situ annealing process is higher than 700° C.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size and are not necessarily drawn to scale, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
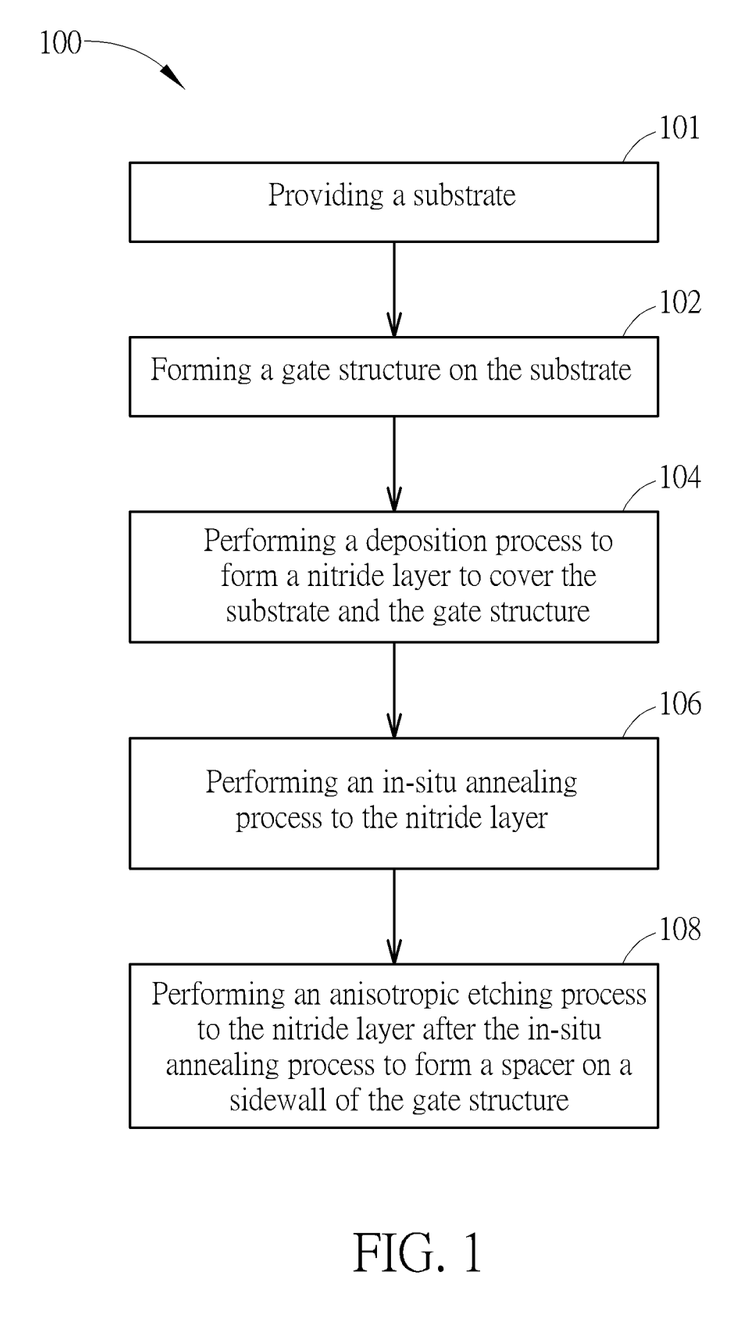
FIG. 1 is a flow chart of a method for forming a semiconductor structure according to an embodiment of the present invention.
Figure 9:
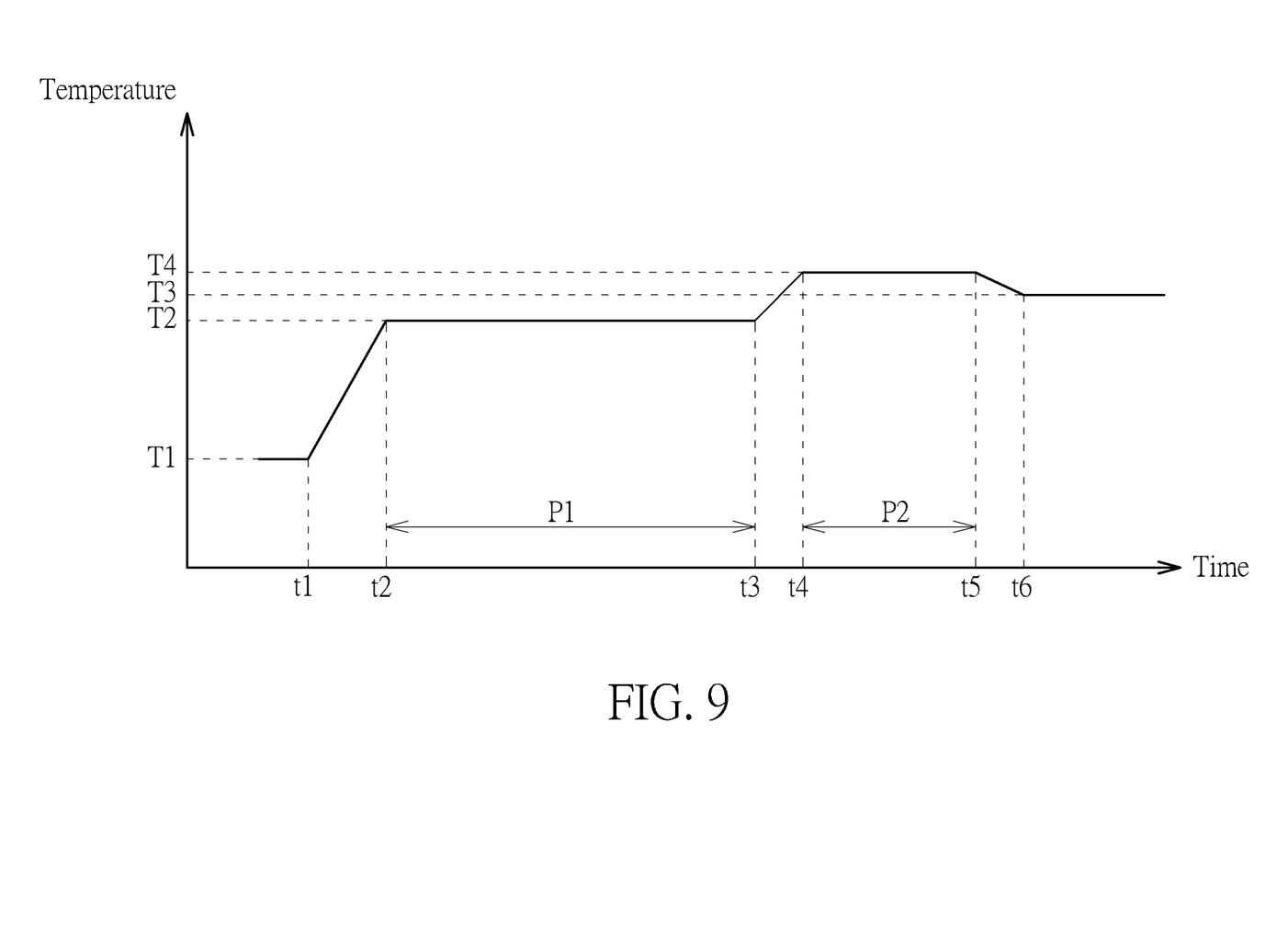
FIG. 9 is a schematic diagram illustrating the temperature versus time during the deposition process and the in-situ annealing process of the method shown in FIG. 1.

FIG. 1 is a flow chart of a method for forming a semiconductor structure according to an embodiment of the present invention. FIG. 2 to FIG. 6 are schematic cross-sectional views of a semiconductor structure at different manufacturing steps of the method shown in FIG. 1. FIG. 9 is a schematic diagram illustrating the temperature versus time during the deposition process and the in-situ annealing process of the method shown in FIG. 1.

Figure 2:
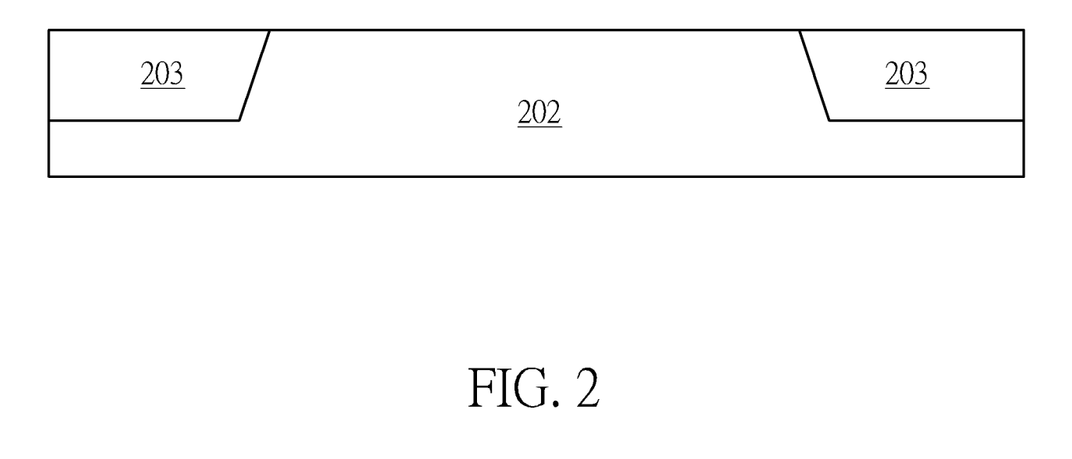
FIG. 2 to FIG. 6 are schematic cross-sectional views of a semiconductor structure at different manufacturing steps of the method shown in FIG. 1.
Figure 3:
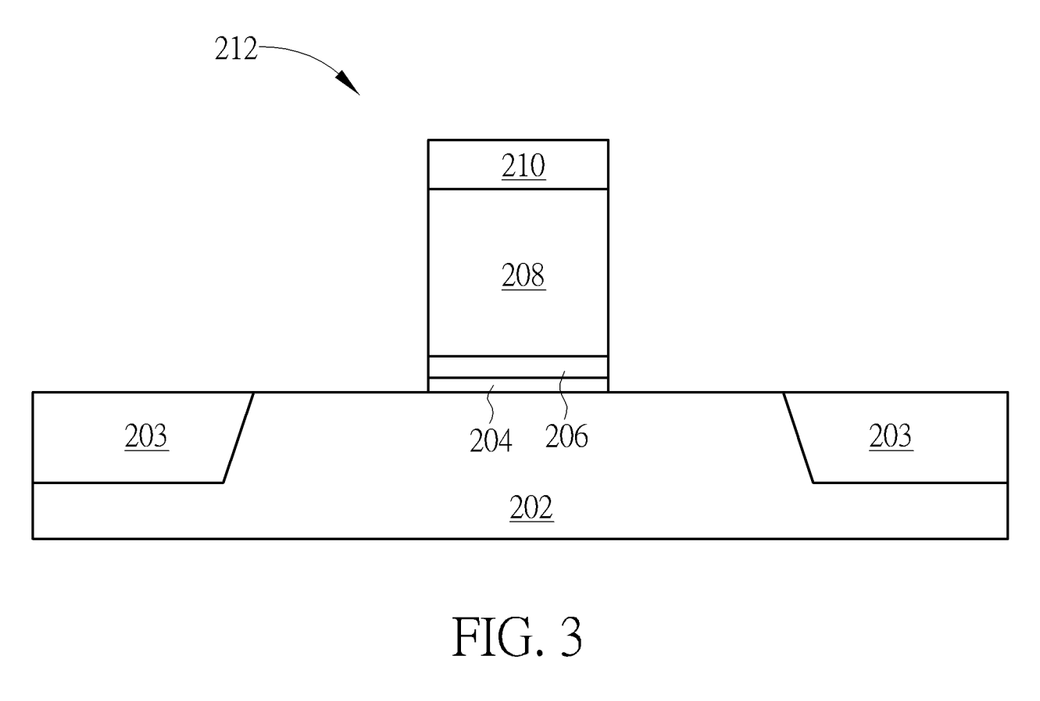

Please refer to FIG. 1, FIG. 2 and FIG. 3. The method 100 begins at step 101, wherein a substrate 202 is provided. The substrate 202 may include a silicon substrate, a silicon-on-insulator substrate (SOI), a silicon germanium (SiGe) substrate, or any other suitable substrates. A plurality of shallow trench isolation (STI) structures 203 may be formed in the substrate 202 to define the active regions. The shallow trench isolation structures 203 may include a dielectric material such as silicon oxide ($SiO_x$) or silicon nitride (SiN), but is not limited thereto.

Subsequently, the method 100 proceeds to step 102, wherein a gate structure 212 is formed on the substrate 202. The gate structure 212 may be a dummy gate structure used to form a metal gate structure. The process to form the gate structure 212 may include forming a gate stacked layer on the substrate 202 and then performing a patterning process to remove unnecessary portions of the gate stacked layer, thereby forming the gate structure 212. According to an embodiment of the present invention, the gate structure 212 may include, from bottom to top, an interfacial layer 204, a high-k dielectric layer 206, a polysilicon layer 208, and a hard mask layer 210. The material of the interfacial layer 204 may include silicon oxide ($SiO_x$), silicon nitride (SiN), or silicon oxynitride (SiON), but is not limited thereto. The high-k dielectric layer 206 may include a dielectric material with a dielectric constant (k) larger than 4. For example, the high-k dielectric layer 206 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof, but is not limited thereto. The material of the polysilicon layer 208 may include doped polysilicon or un-doped polysilicon. The material of the hard mask layer 210 may include silicon carbide (SiC), silicon oxynitride (SiON), silicon nitride (SiN), or silicon nitride carbide (SiCN), but is not limited thereto.

Figure 4:
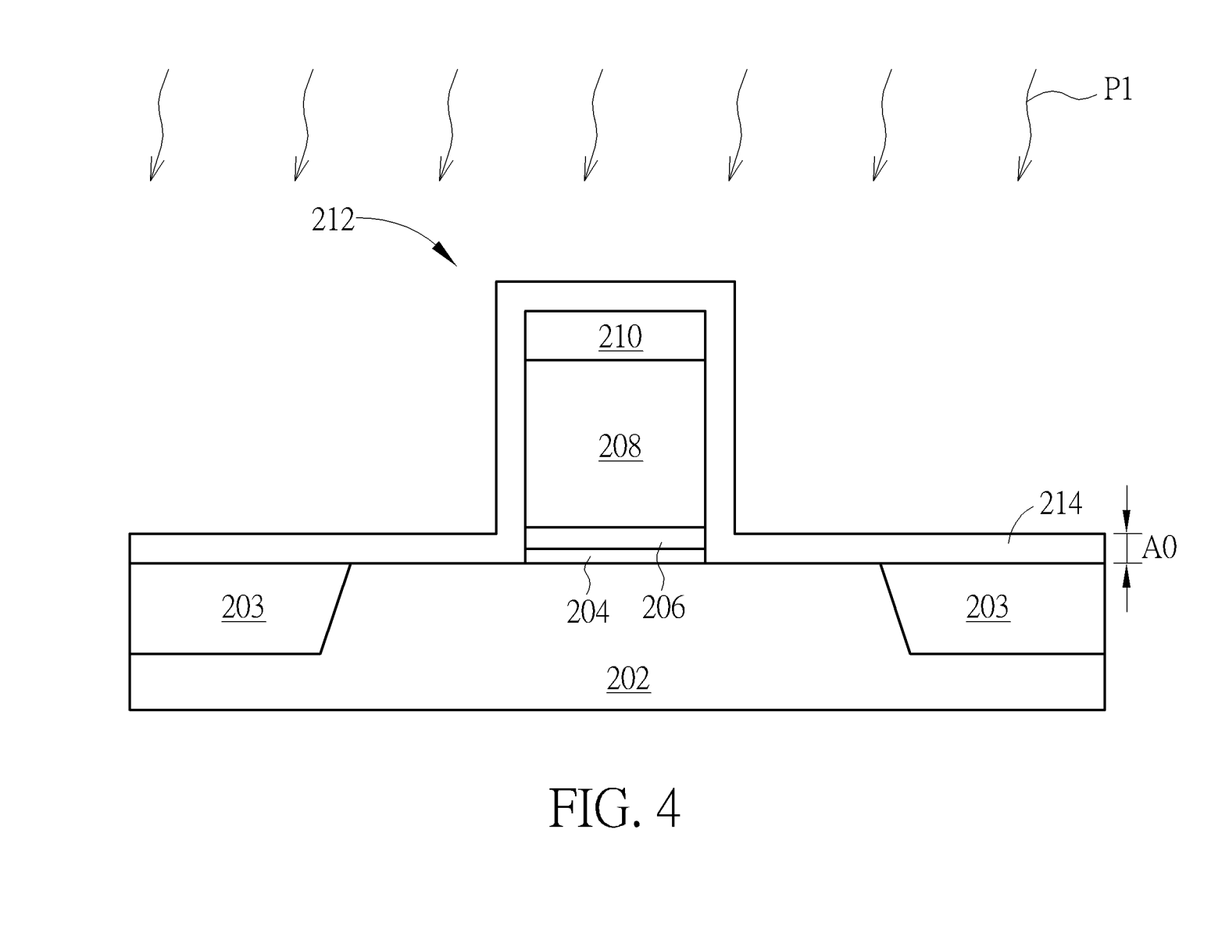

Please refer to FIG. 1, FIG. 4 and FIG. 9. The method 100 proceeds to step 104, wherein a deposition process P1 is performed to form a nitride layer 214 on the substrate 202 in a blanket manner and conformally covering the substrate 202 and the gate structure 212. According to an embodiment of the present invention, the deposition process P1 is a low pressure chemical vapor deposition (LPCVD) process, such as an atomic layer deposition (ALD) process, and may be performed by a low pressure furnace equipment. More specifically, as shown in FIG. 9, after moving the substrate 202 into the process chamber of the low pressure furnace equipment, a heating step (from t1 to t2) is carried out under a nitrogen (N2) atmosphere to raise the temperature from T1 to T2. Following, the deposition process P1 (from t2 to t3) is performed at the temperature T2 and uses nitrogen as the carrier gas to transport source gases such as dichlorosilane (DCS) and ammonia ($NH_3$) into the process chamber to react to form the nitride layer 214 deposited on the substrate 202 and the gate structure 212. According to an embodiment of the present invention, the temperature T1 is between approximately the room temperature and 200° C. The temperature T2 is between approximately 600 and 650° C. The process time of the deposition process P1 (from t2 to t3) may be adjusted according to the pre-determined deposited thickness A0 of the nitride layer 214 and the flow rate of the source gases. According to an embodiment of the present invention, the thickness A0 of the nitride layer 214 is between approximately 80 and 100 Å. The flow rate of dichlorosilane (DCS) is between approximately 1 and 3 slm. The flow rate of the ammonia ($NH_3$) is between approximately 4 and 6 slm. The process time of the deposition process P1 is between approximately 2 and 4 hours. According to an embodiment of the present invention, a liner (such as a silicon oxide layer) may be formed on the substrate 202 and the gate structure 212 before forming the nitride layer 214. The liner may be formed by the low pressure furnace equipment for forming the nitride layer 214, or may be formed by another deposition equipment. The liner (not shown) may serve as a buffer layer between the nitride layer 214 and the substrate 202 and the gate structure 212, and may also serve to provide an etching end-point signal for the subsequent anisotropic etching process of forming the spacer.

Figure 5:
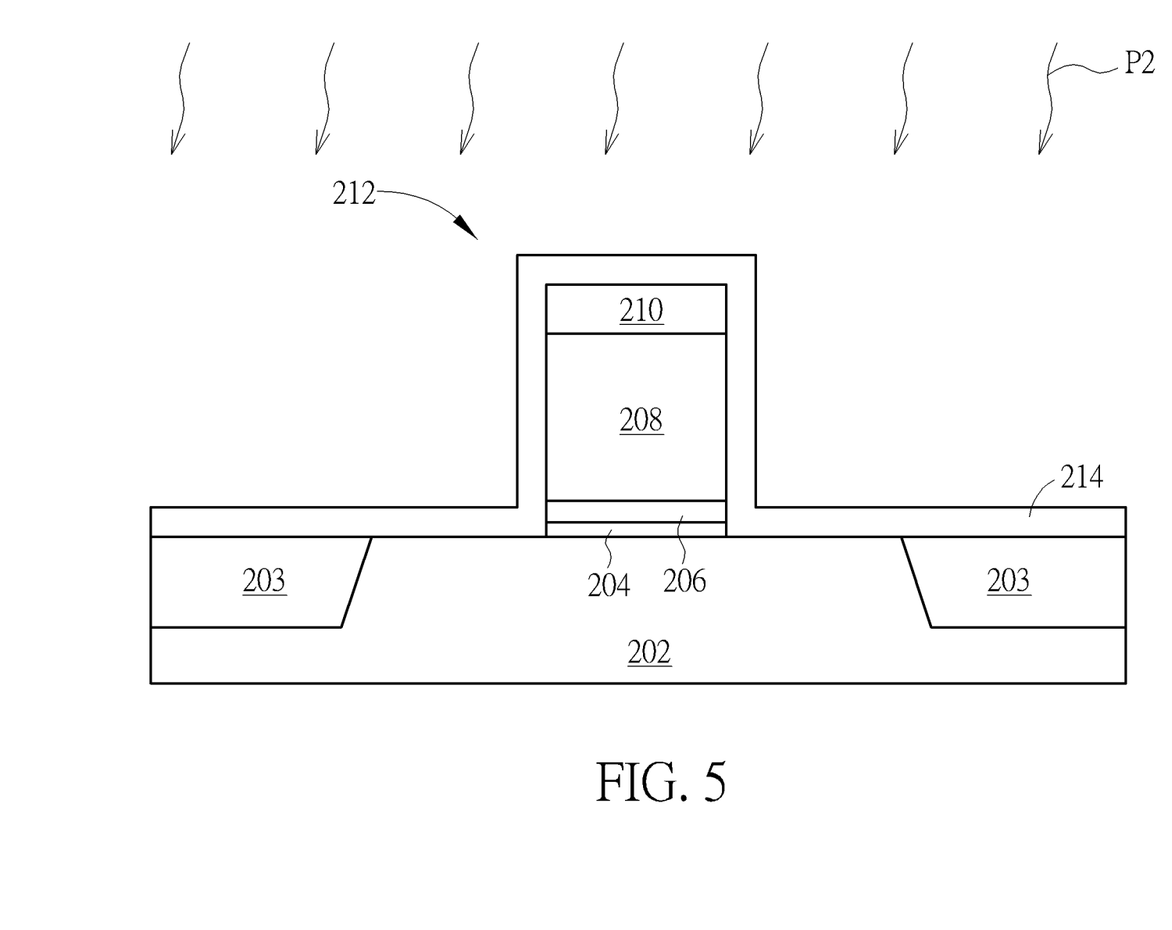

Please refer to FIG. 1, FIG. 5 and FIG. 9. The method 100 proceeds to step 106, wherein an in-situ anneal process P2 is performed to anneal the nitride layer 214. More specifically, as shown in FIG. 9, after finishing the deposition process P1, another heating step (from t3 to t4) is carried out under a nitrogen (N2) atmosphere to raise the temperature from T2 to the T4. Subsequently, the temperature is kept at T4, and the nitride layer 214 undergoes the in-situ anneal process P2 (from t4 to t5) at the temperature T4 under the nitrogen (N2). According to an embodiment of the present invention, the nitrogen (N2) flow rate during the in-situ anneal process P2 is between approximately 20 and 40 slm. The temperature T4 of the in-situ anneal process P2 is higher than 700° C. For example, the temperature T4 may be between approximately 700 and 800° C., or between approximately 750 and 770° C. The process time (the period between t4 to t5) of the in-situ annealing process P2 is between approximately 30 and 120 minutes, or between approximately 50 and 60 minutes. Following, after the in-situ anneal process P2, a cooling step (from t5 to t6) is carried out under a nitrogen (N2) atmosphere to lower the temperature from T4 to T3. The substrate 202 is then moved out from the process chamber of the low pressure furnace equipment. According to an embodiment of the present invention, the temperature T3 is preferably lower than 700° C.

Figure 6:
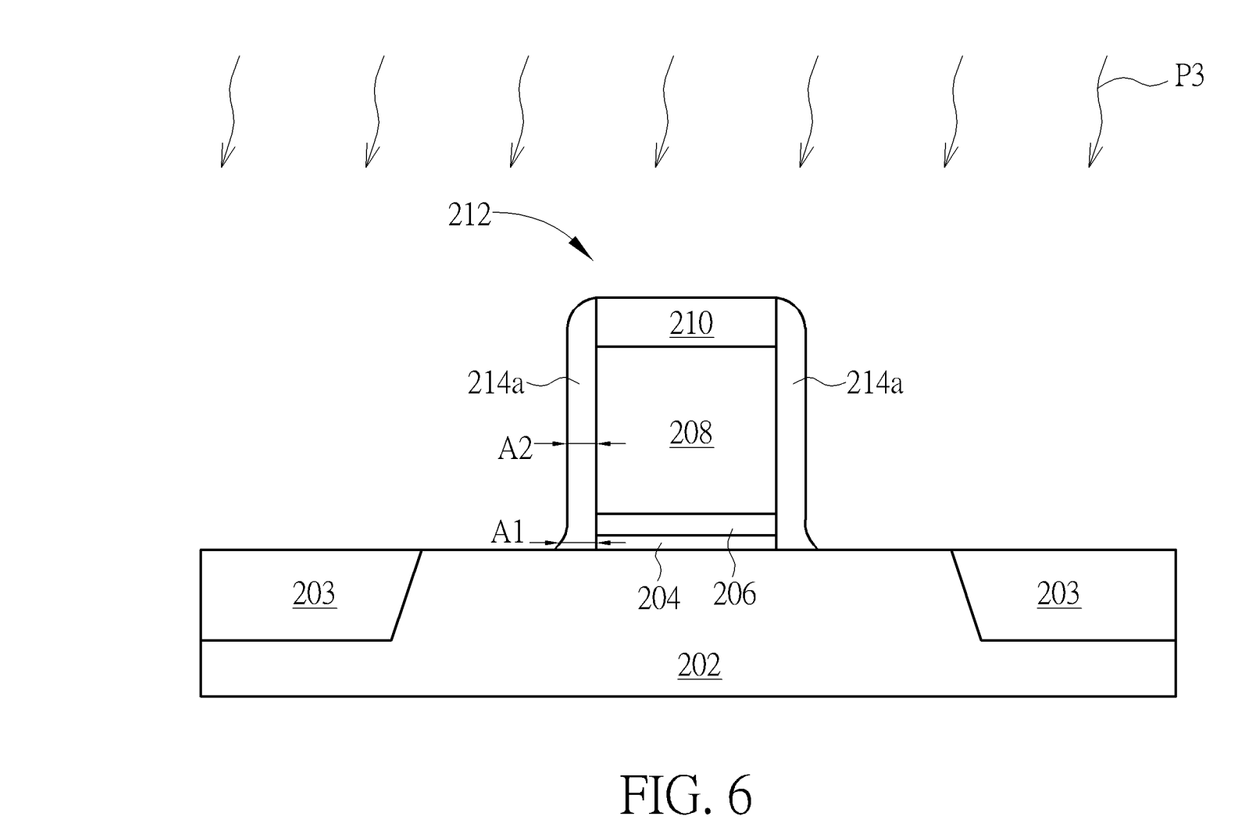

Please refer to FIG. 1 and FIG. 6. The method 100 proceeds to step 108, wherein an anisotropic etching process P3 is performed to etch the nitride layer 214 to form a spacer 214a on the sidewall of the gate structure 212. According to an embodiment of the present invention, the anisotropic etching process P3 is a reactive ion etching process. The anisotropic etching process P3 uses at least one of $CF_4$, $CHF_3$, and $CH_2F_2$ as the etching gas and may optionally use oxygen ($O_2$) as assistant gas to etch the nitride layer 214 by single or multiple etchings stages to form the spacer 214a. According to an embodiment of the present invention, the anisotropic etching process P3 uses $CH_2F_2$, $CHF_3$, and O2, wherein the flow rates of $CH_2F_2$ and $CHF_3$ are between approximately 45 and 200 sccm, and the power is between approximately 300 and 400 watts.

When the lateral removal rate of the nitride layer 214 during the anisotropic etching process P3 is too high, it is likely to cause the width (or the thickness) of the spacer 214a too small or form an undercut profile at the bottom portion of the spacer 214a (the portion of the spacer 214a on the sidewall of the interfacial layer 204). This may also increase the risk that the etching gas may penetrate into the bottom portion of the gate structure 212 and damage the interface layer 204 and/or the high-k dielectric layer 206. To overcome the problem, it is advantageous that the present invention performs the in-situ annealing process P2 after the deposition process P1 to anneal and densify the as-deposited nitride layer 214 under the nitrogen (N2) atmosphere. The in-situ annealed nitride layer 214 may produce a spacer 214a with an extended bottom portion and a larger bottom width (thickness) after the anisotropic etching process P3, and the risk of damage to the interface layer 204 and/or the high-k dielectric layer 206 during the anisotropic etching process P3 may be reduced. According to an embodiment of the present invention, as shown in FIG. 6, the portion of the spacer 214a on the sidewall of the interface layer 204 has a bottom width A1, and the portion of the spacer 214a on the sidewall of the polysilicon layer 208 has a middle width A2. According to an embodiment of the present invention, the bottom width A1 is approximately 1.1 times of the middle width A2.

Figure 7:
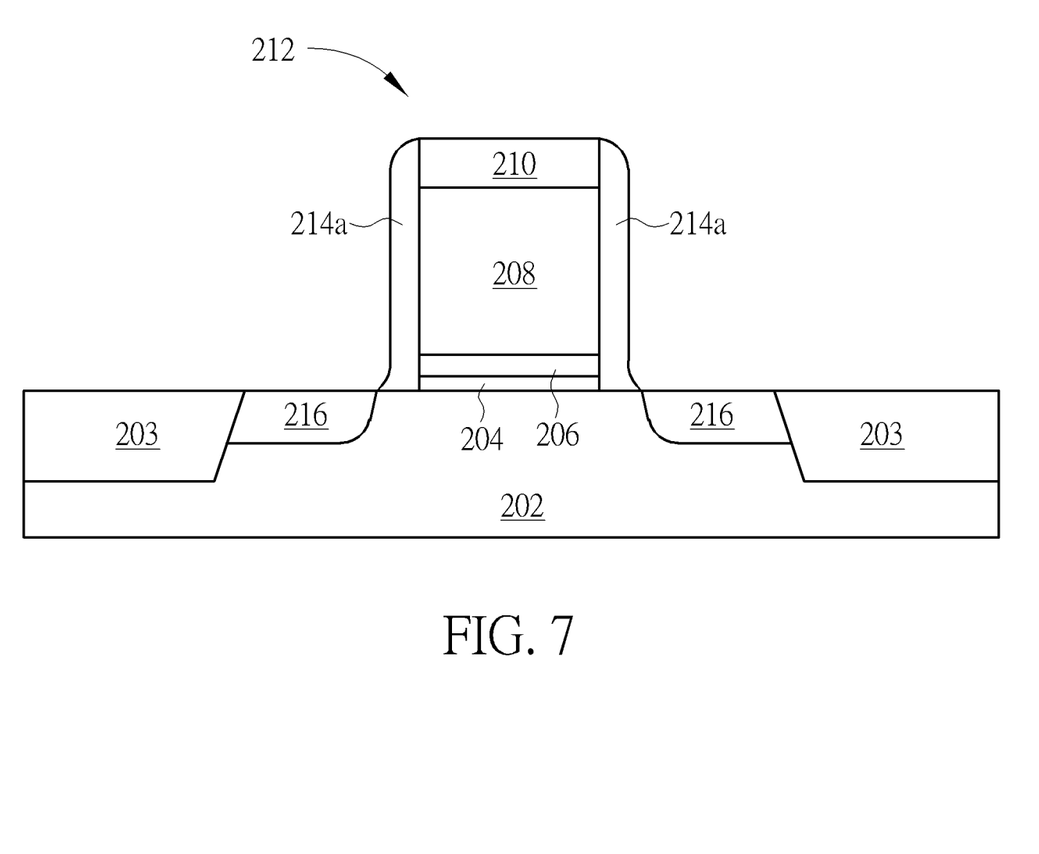
FIG. 7 and FIG. 8 are schematic cross-sectional views of a semiconductor structure at the manufacturing steps after the step shown in FIG. 6 according to an embodiment of the present invention.

Please refer to FIG. 7 and FIG. 8, which are schematic cross-sectional views of a semiconductor structure at the manufacturing steps after the step shown in FIG. 6 according to an embodiment of the present invention. As shown in FIG. 7, after forming the spacer 214a, source/drain regions 216 may be formed in the substrate 202 at two sides of the gate structure 212 and adjacent to the spacer 214a. In some embodiments, the source/drain regions 216 may be formed by ion implantation process to implant a suitable dosage of dopants with suitable conductivity types into the substrate 202. In some embodiments, the source/drain regions 216 may be formed by etching the substrate 202 to form recesses at two sides of the gate structure 212 and epitaxially growing a semiconductor material to fill the recesses.

Figure 8:
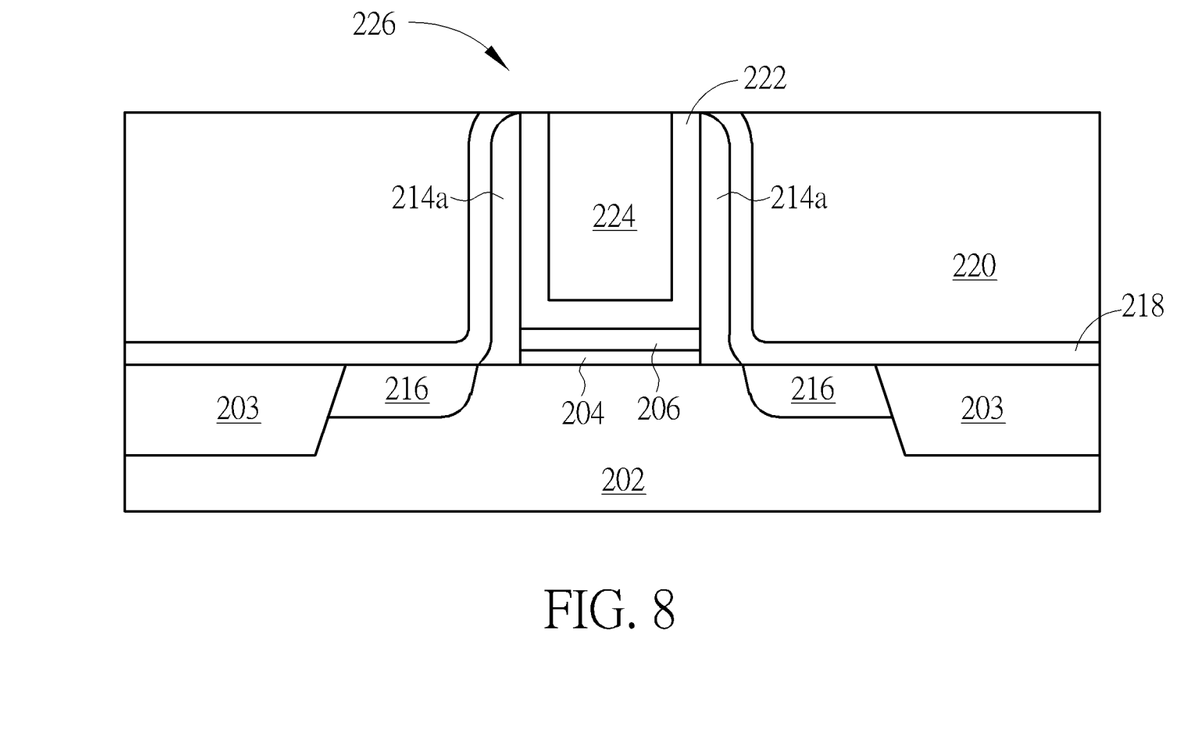

Subsequently, as shown in FIG. 8, a contact etching stop layer 218 and an interlayer dielectric layer 220 are formed on the substrate 202. A replacement metal gate process is then performed to remove the hard mask layer 210 and replace the polysilicon layer 208 with a work-function metal layer 222 and a low resistance metal layer 224, thereby obtaining a metal gate structure 226. The material of the contact etching stop layer 218 may include silicon nitride, silicon oxynitride, silicon carbide, or nitride doped silicon carbide, but is not limited thereto. The material of the interlayer dielectric layer 220 may include silicon oxide or a low-k dielectric material. The material of the work-function metal layer 222 is selected according to the conductivity type of the semiconductor structure. For example, when the semiconductor structure is to form a NMOS transistor, the work function metal layer 222 may have a work function ranging between 3.9 eV and 4.3 eV and may include titanium aluminide (TiAl), zirconium aluminide (ZrAl), tungsten aluminide (WAl), tantalum aluminide (TaAl), hafnium aluminide (HfAl), titanium aluminum carbide (TiAlC), or a combination thereof, but it is not limited thereto. When the semiconductor structure is to form a PMOS transistor, the work function metal layer 222 may have a work function ranging between 4.8 eV and 5.2 eV and may include titanium nitride (TiN), tantalum nitride (TaN), tantalum carbide (TaC), or a combination thereof, but it is not limited thereto. The material of the low resistance metal layer 224 may include copper (Cu), aluminum (Al), titanium aluminum (TiAl), cobalt tungsten phosphide (CoWP), or a combination thereof, but is not limited thereto. According to an embodiment of the present invention, a barrier layer (not shown) may be formed between the work function metal layer 222 and the high-k dielectric layer 206 and/or between the work function metal layer 222 and the low resistance metal layer 224. The material of the barrier layer may include titanium (Ti), titanium nitride (TiN), tantalum (Ta), tantalum nitride (TaN), or a combination thereof, but is not limited thereto.

In summary, the present invention provides a method for forming a semiconductor structure that includes performing an in-suit annealing process to the as-deposited nitride layer in the deposition equipment to densify the nitride layer. The in-suit annealing process is performed successively after the deposition process without moving the substrate out from the deposition equipment. The densified nitride layer may have a lower lateral removal rate during a subsequent anisotropic etching process, thereby producing a spacer with an extended bottom portion and a larger bottom width (thickness). The risk of damaging the interfacial layer or high-k dielectric layer under the gate structure during the anisotropic etching process may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   forming a gate structure on a substrate, wherein the gate structure comprises:
   an interfacial layer on the substrate;
   a high-k dielectric layer on the interfacial layer;
   a polysilicon layer on the high-k dielectric layer; and
   a hard mask layer on the polysilicon layer;
   performing a deposition process to form a nitride layer to cover the substrate and the gate structure, wherein a process temperature of the deposition process is between 600° C. and 650° C.;
   performing an in-situ annealing process to the nitride layer, wherein a process temperature of the in-situ annealing process is higher than 700° C.; and
   performing an anisotropic etching process to the nitride layer after the in-situ annealing process to form a spacer on the substrate and covering sidewalls of the interfacial layer, the high-k dielectric layer, the polysilicon layer and the hard mask layer of the gate structure, wherein a bottom width of a portion of the spacer on the sidewall of the interfacial layer is 1.1 times of a middle width of another portion of the spacer on the sidewall of the polysilicon layer.

2. The method for forming a semiconductor structure according to claim 1, wherein the deposition process is a low pressure chemical vapor deposition (LPCVD) process using dichlorosilane (DCS) and ammonia (NH3) as source gases to form the nitride layer.

3. The method for forming a semiconductor structure according to claim 1, wherein the in-situ annealing process is performed in a nitrogen (N2) atmosphere.

4. The method for forming a semiconductor structure according to claim 1, wherein the process temperature of the in-situ annealing process is higher than 700° C. and lower than 800° C.

5. The method for forming a semiconductor structure according to claim 4, wherein the process temperature of the in-situ annealing process is between 750° C. and 770° C.

6. The method for forming a semiconductor structure according to claim 1, wherein a process time of the in-situ annealing process is between 30 and 120 minutes.

7. The method for forming a semiconductor structure according to claim 1, wherein a thickness of the nitride layer is between 80 and 100 Å.

8. The method for forming a semiconductor structure according to claim 1, wherein the deposition process and the in-situ annealing process are performed by a same low pressure furnace equipment.

9. The method for forming a semiconductor structure according to claim 1, wherein the anisotropic etching process comprises using O2, CH2F2 and CHF3.

10. The method for forming a semiconductor structure according to claim 1, further comprising forming a source/drain region in the substrate and adjacent to the spacer.

* * * * *